United States Patent
Lee et al.

(10) Patent No.: US 10,644,682 B2
(45) Date of Patent: May 5, 2020

(54) DIFFERENTIAL RELAXATION OSCILLATOR REDUCING NOISE EFFECT USING DIFFERENTIAL STRUCTURE AND SWING BOOSTER TECHNOLOGY

(71) Applicant: Daegu Gyeongbuk Institute of Science and Technology, Daegu (KR)

(72) Inventors: Jung Hyup Lee, Daegu (KR); Kocheethra George Arup, Daegu (KR); Minkyu Je, Daejeon (KR)

(73) Assignee: Daegu Gyeongbuk Institute of Science and Technology, Daegu (KR)

( * ) Notice: Subject to any disclaimer, the term of this patent is extended or adjusted under 35 U.S.C. 154(b) by 101 days.

(21) Appl. No.: 15/881,232

(22) Filed: Jan. 26, 2018

(65) Prior Publication Data

US 2018/0219536 A1    Aug. 2, 2018

(30) Foreign Application Priority Data

Jan. 31, 2017   (KR) .................. 10-2017-0014020

(51) Int. Cl.
| H03K 4/501 | (2006.01) |
| G06F 1/04 | (2006.01) |
| H03K 3/0231 | (2006.01) |
| H03K 3/012 | (2006.01) |
| H03K 3/013 | (2006.01) |
| H03K 3/011 | (2006.01) |
| G06F 1/32 | (2019.01) |

(52) U.S. Cl.
CPC .............. *H03K 4/501* (2013.01); *G06F 1/04* (2013.01); *H03K 3/012* (2013.01); *H03K 3/013* (2013.01); *H03K 3/0231* (2013.01); *G06F 1/32* (2013.01); *H03K 3/011* (2013.01)

(58) Field of Classification Search
CPC ........ H03K 4/501; H03K 3/012; H03K 3/013; H03K 3/0231; H03K 3/011; G06F 1/04; G06F 1/32
See application file for complete search history.

(56) References Cited

U.S. PATENT DOCUMENTS

2008/0204155 A1 *  8/2008  Olmos ................... H03K 3/011
                                                             331/108 R
2017/0104475 A1 *  4/2017  Lam ....................... H03L 7/107

OTHER PUBLICATIONS

A 1.4V 10.5MHz Swing-Boosted Differential Relaxation Oscillator with 162.1dBc/Hz FOM and 9.86psrms Period Jitter in 0.18μm CMOS. Published on Feb. 1, 2016 on ISSCC 216.
A 90μW 12MHz Relaxation Oscillator with a-162dB FOM. Paul F. J. Geraedts, Ed van Tuijl, Eric A. M. Klumperink, Gerard J. M. Wienk, Bram Nauta University of Twente, Enschede, Netherlands. Digital Tech. Papers, Feb. 20089, pp. 348-349.

(Continued)

*Primary Examiner* — Jeffrey M Shin
(74) *Attorney, Agent, or Firm* — Bond Schoeneck & King, PLLC; George McGuire

(57) ABSTRACT

Disclosed is a differential relaxation oscillator using a differential structure that may stably maintain a differential voltage swing of capacitors despite an influence of an offset voltage and 1/f noise of a comparator, and also generate a dynamic current only at a point in time at which switching is performed, thereby minimizing power consumption.

5 Claims, 5 Drawing Sheets

(56) References Cited

OTHER PUBLICATIONS

Ying Cao, Paul Leroux, Wouter De Cock, Michiel Steyaert (2013), A 63,000 Q-factor relaxation oscillator with switched-capacitor integrated error feedback IEEE International Solid-State Circuits Conference Digest of Technical Papers, 2013, pp. 186-187.
Kunil Choe, Olivier D. Bernal, David Nuttman, Minkyu Je; A Precision Relaxation Oscillator with a Self-Clocked Offset-Cancellation Scheme for Implantable Biomedical SoCs. Institute of Microelectronics, Singapore, Singapore.

* cited by examiner

DIFFERENTIAL RELAXATION OSCILLATOR REDUCING NOISE EFFECT USING DIFFERENTIAL STRUCTURE AND SWING BOOSTER TECHNOLOGY

CROSS-REFERENCE TO RELATED APPLICATION(S)

This application claims the priority benefit of Korean Patent Application No. 10-2017-0014020 filed on Jan. 31, 2017, in the Korean Intellectual Property Office, the disclosure of which is incorporated herein by reference for all purposes.

BACKGROUND

1. Field

One or more example embodiments relate to an oscillator, and more particularly, to a differential relaxation oscillator.

2. Description of Related Art

An oscillating device or an oscillator refers to a device configured to generate a periodic signal, and may be used to generate alternating current (AC) power in combination with direct current (DC) power. A relaxation oscillator refers to a type of oscillator configured to generate a square wave or sawtooth wave signal. A frequency of the relaxation oscillator may be determined based on time at which a capacitor is charged and discharged.

Compared to a ring oscillator, which is another type of oscillator, the relaxation oscillator may be desirable in terms of frequency stability and control linearity, and have a wider variable frequency range. Thus, the relaxation oscillator may be used in important parts such as a reference frequency source or a sensor front end. However, an actually produced noise characteristic of the relaxation oscillator may be less desirable than that of the ring oscillator, although the noise characteristic of the relaxation oscillator is estimated to be more desirable than that of the ring oscillator in theory. The relaxation oscillator is provided in a single-ended structure including a common ground electrode.

SUMMARY

An aspect provides a differential relaxation oscillator that may improve noise performance while minimizing power consumption.

According to an example embodiment, there is provided a differential relaxation oscillator including a differential swing booster configured to switch a plurality of capacitors to connect to a direct current (DC) power supply or a ground electrode based on a switching period, and a comparator configured to adjust the switching period by comparing a voltage of each of the capacitors to a preset threshold voltage. The capacitors may be switched to connect to the DC power supply or the ground electrode such that a voltage difference between the capacitors is greater than or equal to a voltage of the DC power supply in each switching period.

The comparator may include a clock generator configured to generate a clock signal to adjust the switching period using the voltage of each of the capacitors, at a point in time at which the voltage of each of the capacitors is equal to the threshold voltage.

The clock generator may include an inverter configured to generate the clock signal by inverting the voltage of each of the capacitors when a current is applied at the point in time at which the voltage of each of the capacitors is equal to the threshold voltage.

The comparator may include a bias voltage generator configured to generate a bias voltage to be applied to a gate electrode of a transistor connected to the inverter based on an operating point of the inverter.

The differential swing booster may include a switch configured to alternately connect each of the capacitors to the DC power supply or the ground electrode based on the clock signal.

When the comparator combines an offset voltage with the voltage of each of the capacitors, the capacitors may be charged based on the offset voltage before being switched to connect to the DC power supply or the ground electrode based on the switching period.

According to example embodiments described herein, the differential relaxation oscillator may improve noise performance while minimizing power consumption.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the present disclosure will become apparent and more readily appreciated from the following description of example embodiments, taken in conjunction with the accompanying drawings of which.

DETAILED DESCRIPTION

Figure 1:
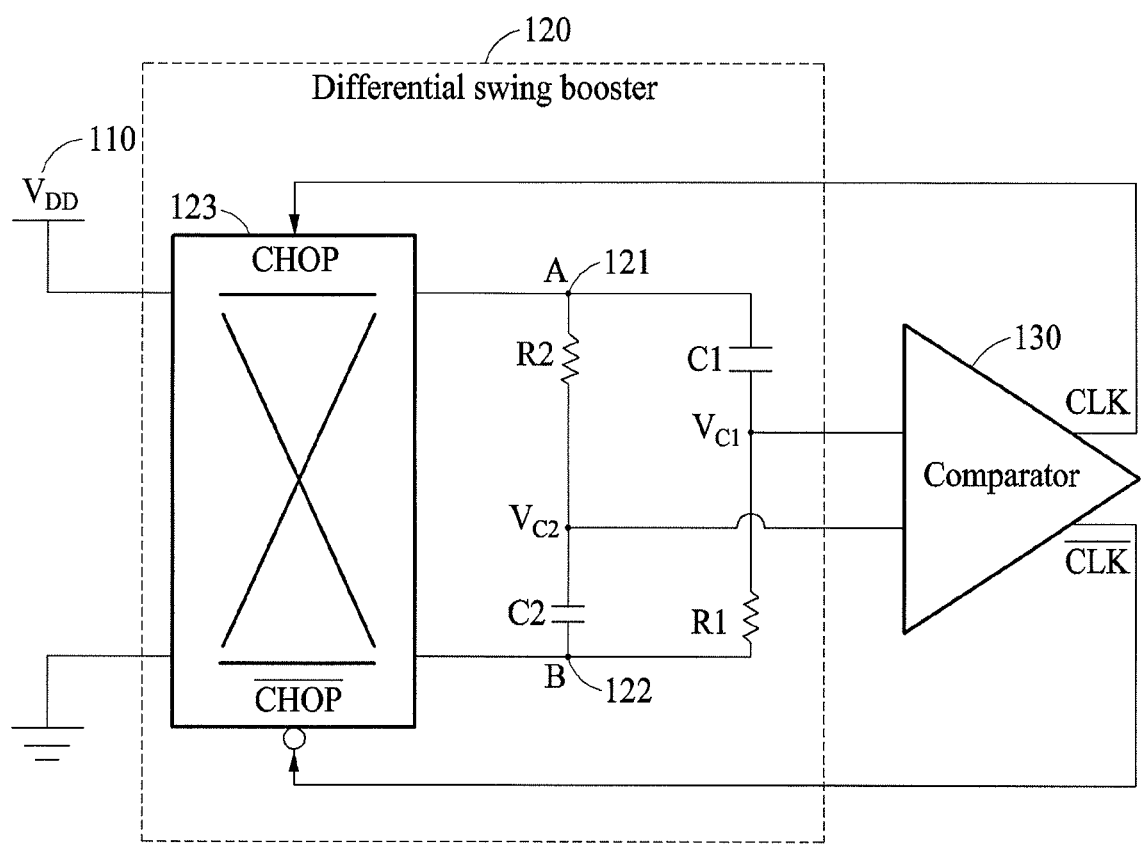
FIG. 1 is a diagram illustrating a structure of a differential relaxation oscillator according to an example embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Terms such as first, second, A, B, (a), (b), and the like may be used herein to describe components. Each of these terminologies is not used to define an essence, order, or sequence of a corresponding component but used merely to distinguish the corresponding component from other component(s). For example, a first component may be referred to as a second component, and similarly the second component may also be referred to as the first component.

It should be noted that if it is described in the specification that one component is "connected," "coupled," or "joined" to another component, a third component may be "connected," "coupled," and "joined" between the first and second components, although the first component may be directly connected, coupled or joined to the second component. In addition, it should be noted that if it is described in the specification that one component is "directly connected" or "directly joined" to another component, a third component may not be present therebetween. Likewise, expressions, for example, "between" and "immediately between" and "adjacent to" and "immediately adjacent to" may also be construed as described in the foregoing.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

Unless otherwise defined, all terms, including technical and scientific terms, used herein have the same meaning as commonly understood by one of ordinary skill in the art to which this disclosure pertains based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings.

FIG. 1 is a diagram illustrating a structure of a differential relaxation oscillator according to an example embodiment. A differential relaxation oscillator may generate an alternating current (AC) voltage using a direct current (DC) power supply 110 configured to output a preset voltage. In FIG. 1, it is assumed that the DC power supply 110 outputs a preset voltage, for example, $V_{DD}$.

Referring to FIG. 1, the differential relaxation oscillator includes a differential swing booster 120 configured to switch a plurality of capacitors to connect to the DC power supply 110 or a ground electrode based on a switching period. The differential swing booster 120 includes a resistor-capacitor (RC) circuit in which each of the capacitors is connected in series to a resistor, and a switch 123.

The RC circuit of the differential swing booster 120 may be connected to the DC power supply 110 or the ground electrode through a node A 121 and a node B 122 connected to the switch 123. Each of the capacitors may be connected to a corresponding resistor. As illustrated in FIG. 1, a capacitor C1 is connected in series to a resistor R1, and a capacitor C2 is connected in series to a resistor R2. Such series connections of capacitors and resistors may be connected in parallel at the node A 121 and the node B 122.

When the RC circuit is connected in parallel to the node A 121 and the node B 122, the capacitors of respective series connections of the RC circuit may be connected to different nodes. As illustrated in FIG. 1, in the series connection of the capacitor C1 and the resistor R1, the capacitor C1 is connected to the node A 121, and the resistor R1 is connected to the node B 122. Also, in the series connection of the capacitor C2 and the resistor R2, the resistor R2 is connected to the node A 121 and the capacitor C2 is connected to the node B 122.

The switch 123 may connect each of the capacitors alternately to the DC power supply 110 or the ground electrode based on a clock signal. The switch 123 may be a chopper switch. The switch 123 may be connected to the capacitors through the two nodes, and connect one of the nodes to the DC power supply 110 and simultaneously connect the other to the ground electrode. The switch 123 may be connected to the RC circuit through the node A 121 and the node B 122. The switch 123 may connect the node A 121 to the DC power supply 110, and simultaneously connect the node B 122 to the ground electrode.

The switch 123 may connect one of the node A 121 and the node B 122 to the DC power supply 110 based on a control signal. The switch 123 may control connections of the two nodes simultaneously, and thus receive two control signals. The switch 123 may receive the control signal from a comparator 130.

The differential relaxation oscillator includes the comparator 130 configured to adjust a switching period of the switch 123 by comparing a voltage of each of the capacitors to a preset threshold voltage. The comparator 130 may generate a clock signal based on the switching period, and the generated clock signal may be used as a control signal for the switch 123. A detailed structure of the switch 123 will be described later with reference to FIG. 3.

The switch 123 may alternately connect each of the capacitors to the DC power supply 110 or the ground electrode at each switching period, and thus a difference between voltages of the capacitors may be greater than or equal to a voltage of the DC power supply 110 at each switching period. Hereinafter, how a voltage of each of the capacitors of the differential swing booster 120 changes when switching is performed based on a clock signal of the comparator 130 of the differential relaxation oscillator will be described in detail with reference to FIGS. 1 and 2.

Figure 2:
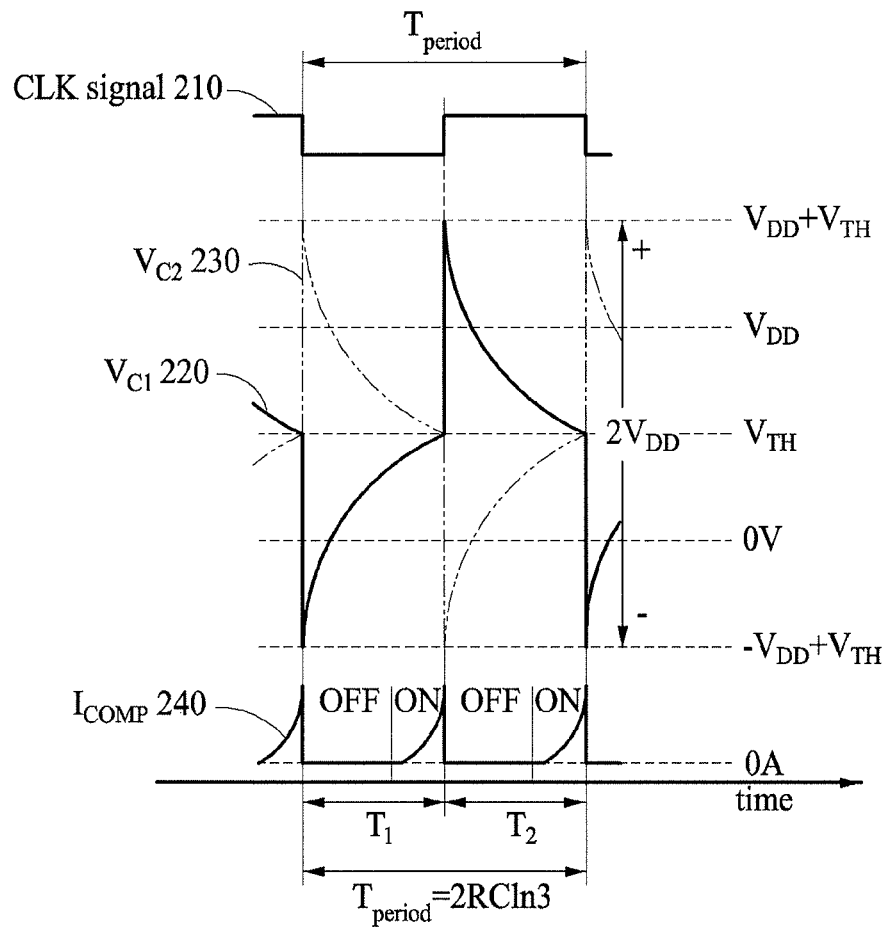
FIG. 2 is a graph illustrating a change in a voltage of each of capacitors C1 and C2 of FIG. 1 based on a clock signal generated by a comparator of FIG. 1.

FIG. 2 is a graph illustrating a change in a voltage of each of the capacitor C1 and the capacitor C2 of FIG. 1 based on a clock signal generated by the comparator 130 of FIG. 1.

FIG. 2 illustrates a change in a voltage of a clock signal 210, or a CLK signal as illustrated, which is generated by the comparator 130 of FIG. 1, based on time. As described above, the clock signal 210 may be transferred from the comparator 130 to the switch 123 of FIG. 1. Referring to FIG. 2, a voltage of the clock signal 210 may become a preset high voltage at each switching period $T_{period}$. Here, the switching period $T_{period}$ may be determined to be $2RC\ln 3$ ($T_{period}=2RC\ln 3$) with respect to a resistor R and a capacitor C of FIG. 1.

As illustrated in FIG. 2, a voltage $V_{C1}$ 220 of the capacitor C1 of FIG. 1 and a voltage $V_{C2}$ 230 of the capacitor C2 of FIG. 1 change over time. When the voltage of the clock signal 210 is the high voltage, the node A 121 of FIG. 1 may be connected to the DC power supply 110 of FIG. 1, and the node B 122 may be connected to the ground electrode. That is, a voltage of the node A 121 may be $V_{DD}$. The comparator 130 may adjust the clock signal 210 based on a result of comparing $V_{C1}$ 220 and $V_{C2}$ 230 to a preset threshold voltage, for example, $V_{TH}$ as illustrated in FIG. 2.

At a point in time at which $V_{C1}$ 220 and $V_{C2}$ 230 are equal to $V_{TH}$, the comparator 130 may invert, or flip, the clock signal 210. That is, when the voltage of the clock signal 210 is the high voltage, the comparator 130 may invert the voltage of the clock signal 210 to a preset low voltage. Conversely, when the voltage of the clock signal 210 is the low voltage, the comparator 130 may invert the voltage of the clock signal 210 to the preset high voltage.

When the voltage of the clock signal 210 becomes the low voltage, the node A 121 may be connected to the ground electrode, and the node B 122 may be connected to the DC power supply 110. That is, each time the voltage of the clock signal 210 is inverted, the voltage of the node A 121 and the voltage of the node B 122 may change alternately to one of a voltage of the DC power supply 110 and a voltage of the ground electrode.

When the voltage of the clock signal 210 becomes the low voltage, VC1 220 may become $-V_{DD}+V_{TH}$, and $V_{C2}$ 230 may become $V_{DD}V_{TH}$. During a time T1 in which the voltage of the clock signal 210 is being maintained low, $V_{C1}$ 220 may increase to $V_{TH}$, and $V_{C2}$ 230 may decrease to $V_{TH}$.

When $V_{C1}$ 220 and $V_{C2}$ 230 are equal to $V_{TH}$ again, the clock signal 210 may be inverted again. At a point in time at which the time T1 elapses after the voltage of the clock signal 210 is inverted to the low voltage, $V_{C1}$ 220 and $V_{C2}$ 230 may become equal to $V_{TH}$. At this point in time, the voltage of the clock signal 210 may be inverted from the low voltage to the high voltage.

When the voltage of the clock signal 210 is inverted to the high voltage again, the node A 121 may be connected to the DC power supply 110, and the node B 122 may be connected to the ground electrode. At a point in time at which the voltage of the clock signal 210 is inverted again to the high voltage, $V_{C1}$ 220 may change to $V_{DD}+V_{TH}$ and $V_{C2}$ 230 may change to $-V_{DD}+V_{TH}$.

During a time T2 in which the voltage of the clock signal 210 is being maintained high, $V_{C1}$ 220 may decrease to $V_{TH}$ and $V_{C2}$ 230 may increase to $V_{TH}$. When $V_{C1}$ 220 and $V_{C2}$ 230 become equal to $V_{TH}$ again, the voltage of the clock signal 210 may be inverted again from the high voltage to the low voltage.

Therefore, referring to FIG. 2, a difference between a maximum value and a minimum value of each of $V_{C1}$ 220 and $V_{C2}$ 230 may be $2V_{DD}$. That is, a swing of each of capacitors of a differential relaxation oscillator according to an example embodiment may become twice a DC voltage, for example, $2V_{DD}$. That is, each time the voltage of the clock signal 210 is inverted, a difference between $V_{C1}$ 220 and $V_{C2}$ 230 may be $2V_{DD}$. Thus, a difference between a maximum value and a minimum value of $V_{C1}-V_{C2}$ may be $4V_{DD}$. That is, a differential voltage swing, for example, $V_{C1}-V_{C2}$, of the differential relaxation oscillator may be $4V_{DD}$. According to an example embodiment, the differential relaxation oscillator may generate an AC voltage using a differential voltage, and thus a noise performance may be improved. In addition, the differential relaxation oscillator may use a differential structure, and thus the differential relaxation oscillator may be less affected by common-mode noise, such as, for example, supply voltage noise.

Considering thermal noise of the differential relaxation oscillator, clock noise of a clock generated by the differential relaxation oscillator may have a proportional relationship as represented by Equation 1.

$$\sigma_{\Delta t}^2 \propto \frac{\sigma_{V_n}^2}{\text{Slope}(V_{C1}-V_{C2})} \qquad \text{[Equation 1]}$$

In Equation 1, $\sigma_{\Delta t}^2$ denotes clock noise of a clock generated by the differential relaxation oscillator, and $\sigma_{V_n}^2$ denotes noise of a comparator, for example, the comparator 130, included in the differential relaxation oscillator. Slope ($V_{C1}-V_{C2}$) denotes a difference between $V_{C1}$ 220 and $V_{C2}$ 230 of FIG. 2, or a slope of a differential voltage. Referring to Equation 1, as the noise of the comparator 130 decreases and the slope of the differential voltage increases, the clock noise $\sigma_{\Delta t}^2$ of the clock may decrease. In addition, Equation 1 may affect noise of a high-frequency region. An offset voltage of the comparator 130 and 1/f noise may affect noise of a low-frequency region.

The differential relaxation oscillator may maximize the differential voltage swing. As described above, the differential relaxation oscillator may increase the differential voltage swing to four times $V_{DD}$. A clock period is fixed, and thus the slope of the differential voltage may increase as the differential voltage swing increases. Referring back to Equation 1, the differential relaxation oscillator may maximize the differential voltage swing, and thus the clock noise may decrease.

According to an example embodiment, the differential relaxation oscillator may include an inverter-based comparator. The inverter-based comparator will be described later with reference to FIG. 3. Transistors included in an inverter may operate as an amplifier, and thus noise of the comparator may be improved.

To remove an offset voltage and 1/f noise of the comparator, a capacitor of the differential relaxation oscillator may be charged in advance based on the offset voltage. The pre-charging of the capacitor based on such an offset voltage will be described later with reference to FIG. 5. When the capacitor is charged in advance based on the offset voltage, an influence of the offset voltage and the 1/f noise on an entire oscillation period may be restricted. Thus, the differential relaxation oscillator may generate AC power having a constant period irrespective of the offset voltage and the 1/f noise.

Referring to FIG. 2, only at a point in time at which $V_{C1}$ 220 and $V_{C2}$ 230 are equal to $V_{TH}$, a comparison current $I_{COMP}$ 240 may flow in the comparator 130. Hereinafter, operations of the comparator 130 of FIG. 1 will be described in greater detail with reference to FIGS. 2 and 3.

Figure 3:
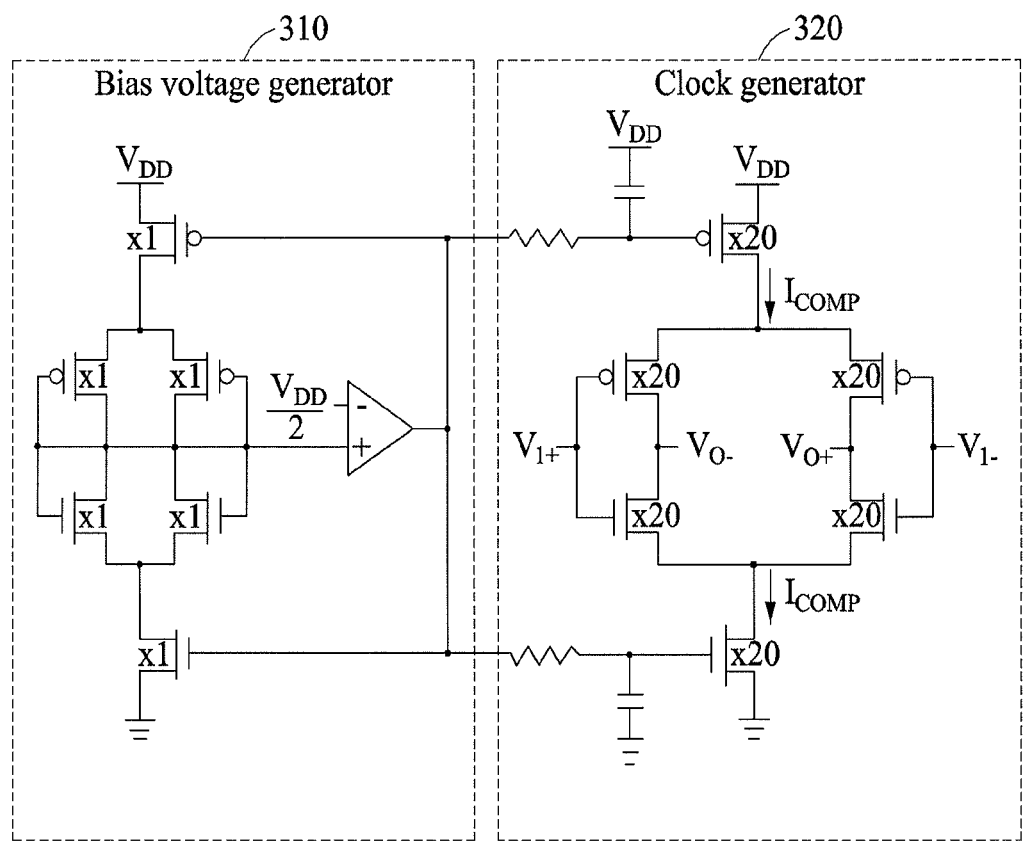
FIG. 3 is a diagram illustrating a structure of a comparator included in a differential relaxation oscillator according to an example embodiment.

FIG. 3 is a diagram illustrating a structure of a comparator included in a differential relaxation oscillator according to an example embodiment. Here, the comparator may be a differential amplifier.

Referring to FIG. 3, the comparator of the differential relaxation oscillator includes a clock generator 320 configured to generate a clock signal that adjusts a switching period at a point in time at which a voltage of each of capacitors is equal to a threshold voltage $V_{TH}$. The clock generator 320 may be structured as an inverter-based differential input pair.

As illustrated in FIG. 3, the clock generator 320 includes an inverter pair configured to generate a clock signal from voltages of the capacitors that are input through input terminals, for example, $V_{I+}$ and $V_{I-}$. The clock signal may be generated when an output voltage of the inverter pair changes based on the switching period. The inverter pair may receive the voltages of the capacitors through the input terminals $V_{I+}$ and $V_{I-}$, and output the clock signal to output terminals, for example, $V_{O+}$ and $V_{O-}$. At a point in time at which the voltages of the capacitors are equal to the threshold voltage $V_{TH}$, a comparison current $I_{COMP}$ may flow in an inverter. That is, only when a voltage of the clock signal is inverted, the comparison current $I_{COMP}$ may flow into the inverter.

That is, the comparator of the differential relaxation oscillator uses an inverter-based differential comparator having a replica biasing function, and thus a dynamic current, for example, the comparison current $I_{COMP}$, may flow only when the voltages of the capacitors reach a value approximate to the threshold voltage $V_{TH}$. Referring back to FIG. 2, the dynamic current $I_{COMP}$ 240 may flow only at a point in time at which the voltages of the capacitors are similar to the threshold voltage $V_{TH}$. A point in time at which the clock signal 210 is inverted may be the same as a point in time at which the dynamic current $I_{COMP}$ 240 flows. Because the dynamic current $I_{COMP}$ 240 flows only at the point in time at which the clock signal 210 is inverted, the comparator may consume power only at the point in time at which the clock signal 210 is inverted. Thus, a noise performance of the differential relaxation oscillator may be improved, and also power consumption may be minimized. In addition, the inverter of the comparator may include a P-type field-effect transistor (FET) or an N-type FET, which has a desirable noise characteristic, and thus the comparator may operate with low noise and low power.

Referring back to FIG. 3, the comparator of the differential relaxation oscillator includes a bias voltage generator 310 configured to generate a bias voltage that determines an operating point of the clock generator 320. A structure of the bias voltage generator 310 may be a replica biasing structure, similarly to that of the clock generator 320. The bias voltage generator 310 may use a transistor, which is smaller in size than a transistor used in the clock generator 320. Power consumption of the bias voltage generator 310 may be determined based on a size of the transistor. For example, in a case in which the bias voltage generator 310 includes a transistor 20 times smaller than a transistor included in the clock generator 320, power consumption of the bias voltage generator 310 may be 1/20 of power consumption of the clock generator 320.

The bias voltage generator 310 may include an operational amplifier (OP-AMP) in which a negative input terminal and a positive input terminal are virtually shorted. As illustrated in FIG. 3, a preset voltage $V_{DD}/2$ is applied to the negative input terminal of the amplifier, and thus an output voltage of the amplifier may be determined such that the voltage $V_{DD}/2$ is to be applied to the positive input terminal based on the virtual short by negative feedback.

Referring to FIG. 3, the bias voltage generator 310 includes an inverter pair connected to the positive input terminal of the amplifier. All input electrodes and output electrodes of the inverter pair of the bias voltage generator 310 may be connected to the supply voltage, the output voltage of the amplifier may be determined such that a voltage applied to the input electrodes and the output electrodes of the inverter pair is to be $V_{DD}/2$. In other words, in a case in which a temperature, a process, or a supply voltage of the differential relaxation oscillator changes, the bias voltage generator 310 may adaptively generate a bias voltage based on the changed temperature, process, or supply voltage.

The output voltage of the amplifier of the bias voltage generator 310, or a bias voltage, may be applied to a gate electrode of a transistor (e.g., a P-type FET) connected to an upper end of the inverter pair and a transistor (e.g., an N-type FET) connected to a lower end of the inverter pair.

Referring back to FIG. 2, the voltage $V_{DD}/2$ of the input electrodes and the output electrodes of the inverter pair of the bias voltage generator 310 is similar to the threshold voltage $V_{TH}$. A point in time at which a voltage of a clock signal is inverted may be an essential point for oscillation. The bias voltage generator 310 may provide the clock generator 320 with a bias voltage having a similar condition to a condition at the point in time at which the clock generator 320 inverts the voltage of the clock signal. That is, the bias voltage generator 310 may provide the clock generator 320 with a most desirable bias voltage at a most essential point.

Figure 4:
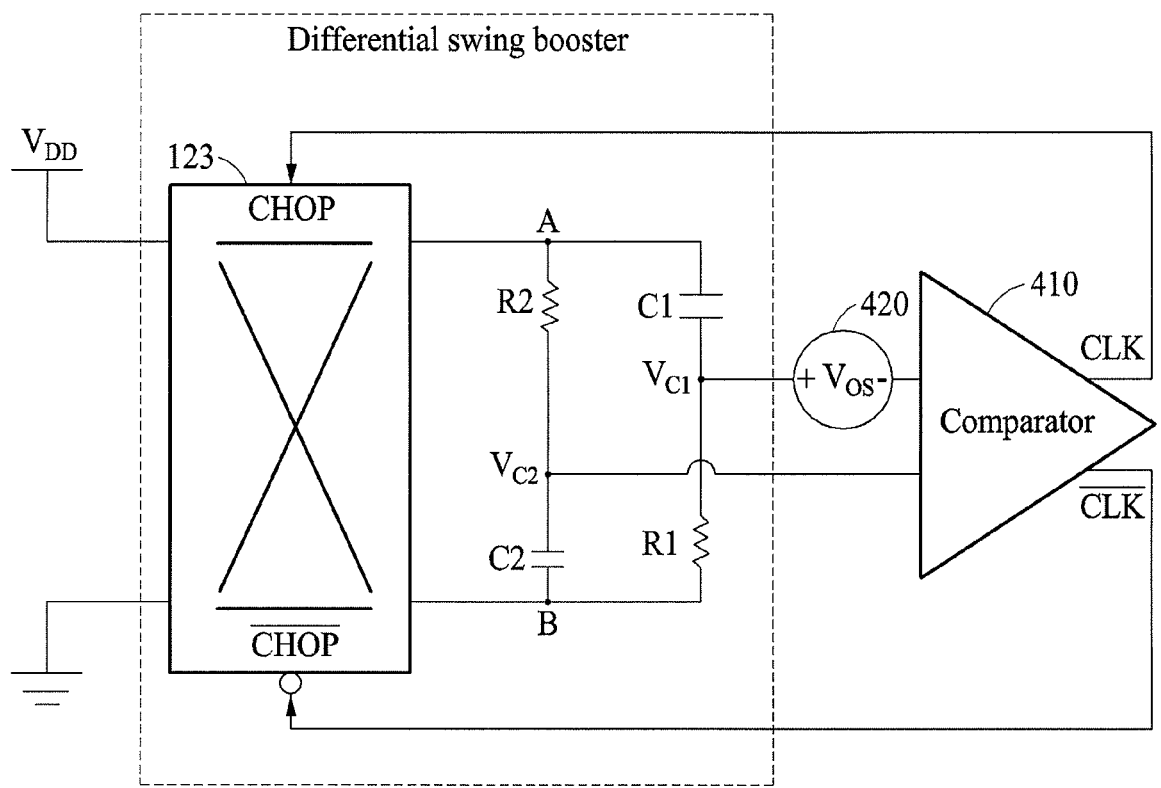
FIG. 4 is a diagram illustrating an example of how a comparator included in a differential relaxation oscillator combines an offset voltage with at least one of respective voltages of capacitors according to an example embodiment.

According to an example embodiment, while the comparator of the differential relaxation oscillator is comparing a voltage of each of the capacitors to a threshold voltage, the comparator may combine an offset voltage with the voltage of each of the capacitors. FIG. 4 is a diagram illustrating an example of how a comparator 410 included in a differential relaxation oscillator combines an offset voltage $V_{OS}$ 420 with at least one of respective voltages of capacitors according to an example embodiment.

Referring to FIG. 4, the comparator 410 combines the offset voltage $V_{OS}$ 420 with a voltage $V_{C1}$ of a capacitor C1. The comparator 410 may compare $V_{C1}$ combined with $V_{OS}$ 420 to a preset threshold voltage $V_{TH}$. Thus, the comparator 410 may not be able to accurately compare a voltage of each of capacitors to a threshold voltage due to an influence of an offset voltage.

Figure 5:
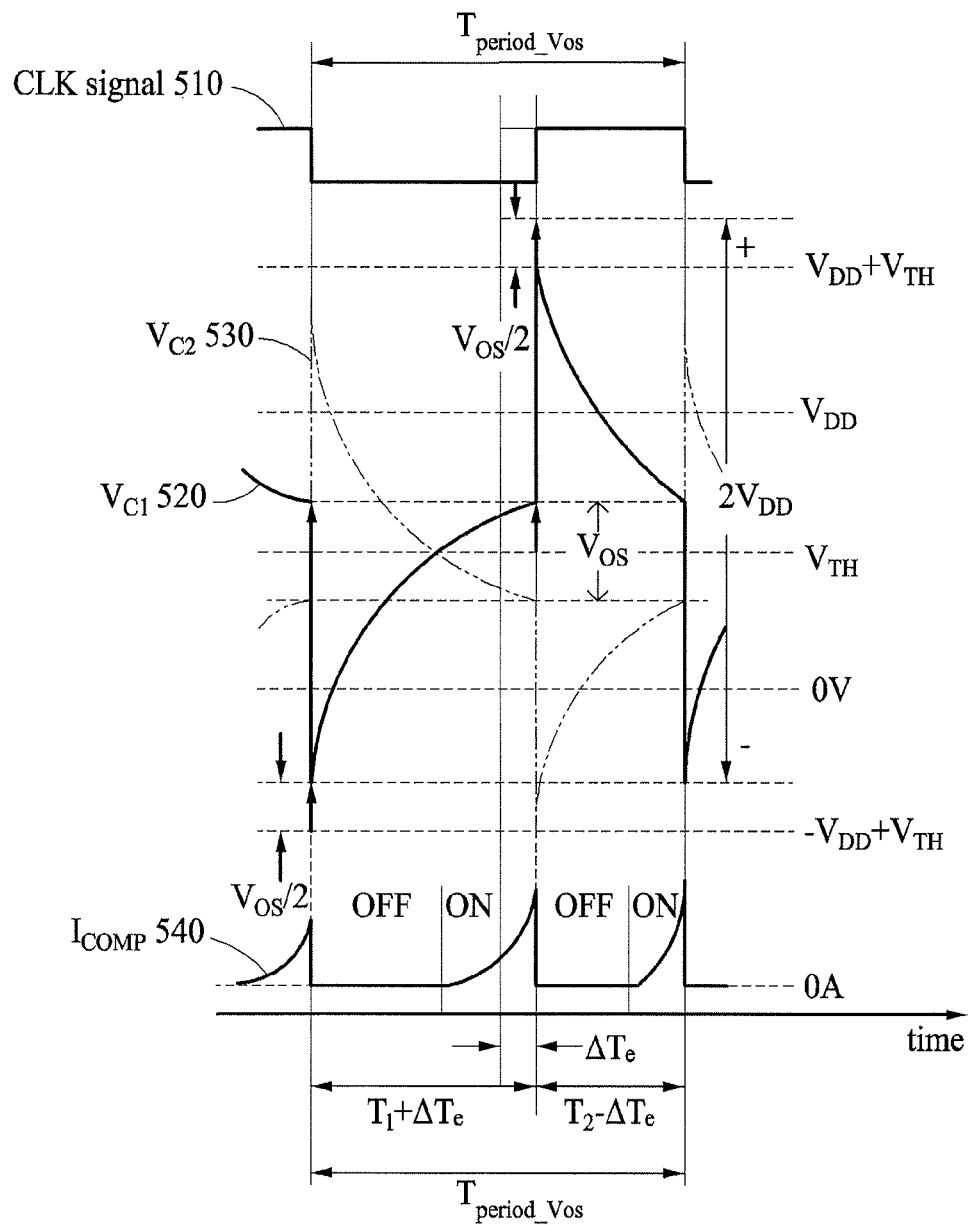
FIG. 5 is a graph illustrating a change in a voltage of each of capacitors based on time, when a comparator of FIG. 4 combines an offset voltage with at least one of respective voltage of capacitors.

FIG. 5 is a graph illustrating a change in a voltage of each of capacitors based on time, when the comparator 410 of FIG. 4 combines an offset voltage with at least one of respective voltages of the capacitors. In FIG. 5, an offset voltage to be combined by the comparator 410 is illustrated as $V_{OS}$. As described above with reference to FIG. 4, it is assumed that the comparator 410 combines the offset voltage $V_{OS}$ with a voltage $V_{C1}$ of a capacitor C1.

Referring to FIG. 5, the comparator 410 compares, to a threshold voltage $V_{TH}$, a voltage of a capacitor that is combined with an offset voltage, and thus a point in time at which a clock signal 510 is inverted may be delayed by $\Delta Te$. That is, a point in time at which a comparison current $I_{COMP}$ 540 flows in the comparator 410 may also be delayed by $\Delta Te$.

According to an example embodiment, when a comparator of a differential relaxation oscillator combines an offset voltage with a voltage of each of capacitors of the differential relaxation oscillator, the capacitors may be charged based on the offset voltage before being switched to connect to a DC power supply or a ground electrode based on a switching period. Referring to FIG. 5, the capacitors may be charged in advance by $V_{OS}/2$ before the switching is started. Thus, despite the offset voltage $V_{OS}$ being combined, a swing of $V_{C1}$ 520 and $V_{C2}$ 530 may be maintained at $2V_{DD}$.

That is, the differential relaxation oscillator may maintain a voltage swing of the capacitors to be constant despite such an offset voltage.

A switching period $T_{period\_VOS}$ of the differential relaxation oscillator with respect to the offset voltage $V_{OS}$ may be determined as represented by Equation 2.

$$T_{period\_VOS} = RC \ln\left(\frac{3V_{DD} + V_{OS}}{V_{DD} + V_{OS}}\right) + RC \ln\left(\frac{3V_{DD} - V_{OS}}{V_{DD} - V_{OS}}\right) \quad \text{[Equation 2]}$$
$$\approx T_{period}$$

In Equation 2, $T_{period\_VOS}$ may be approximated to a switching period $T_{period}$ of the differential relaxation oscillator that is used when the offset voltage $V_{OS}$ is not combined. Referring to FIG. 5, a time in which the clock signal 510 maintains a high voltage is T1+ΔTe, and a time in which the clock signal 510 maintains a low voltage is T2−ΔTe, and thus one period of the clock signal 510 may be T1+T2, or $T_{period}$. Thus, the differential relaxation oscillator may reduce an influence of the offset voltage $V_{OS}$ on the switching period.

The offset voltage $V_{OS}$ and 1/f noise may inversely change the time in which the clock signal 510 maintains the high voltage and the time in which the clock signal 510 maintains the low voltage. Thus, the switching period may be relatively less affected by the offset voltage $V_{OS}$ and the 1/f noise. According to an example embodiment, the differential relaxation oscillator uses a differential structure described herein, and thus may set a switching period irrespective of a threshold voltage of a comparator thereof and also reduce an influence of common-mode noise. Further, the differential relaxation oscillator may reduce an influence of 1/f noise and an input offset voltage of the comparator on the switching period or a differential voltage swing of capacitors of the differential relaxation oscillator.

The components described in the example embodiments of the present disclosure may be achieved by hardware components including at least one digital signal processor (DSP), a processor, a controller, an application specific integrated circuit (ASIC), a programmable logic element such as a field programmable gate array (FPGA), other electronic devices, and combinations thereof. At least some of the functions or the processes described in the example embodiments of the present disclosure may be achieved by software, and the software may be recorded on a recording medium. The components, the functions, and the processes described in the example embodiments of the present disclosure may be achieved by a combination of hardware and software.

The processing device described herein may be implemented using hardware components, software components, and/or a combination thereof. For example, the processing device and the component described herein may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that a processing device may include multiple processing elements and/or multiple types of processing elements. For example, a processing device may include multiple processors or a processor and a controller. In addition, different processing configurations are possible, such as parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums. The non-transitory computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments that accomplish the examples disclosed herein can be easily construed by programmers skilled in the art to which the examples pertain based on and using the flow diagrams and block diagrams of the figures and their corresponding descriptions as provided herein.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A differential relaxation oscillator comprising:
   a differential swing booster configured to switch a plurality of capacitors to connect to a direct current (DC) power supply or a ground electrode based on a switching period; and
   a comparator configured to adjust the switching period by comparing a voltage of each of the capacitors to a preset threshold voltage,
      wherein the differential swing booster is connected to the DC power supply or a ground electrode and switch the capacitors to connect to the DC power supply or the ground electrode such that a voltage difference between the capacitors is greater than or equal to a voltage of the DC power supply in each switching period;
      wherein the comparator comprises a clock generator configured to generate a clock signal to adjust the switching period using the voltage of each of the capacitors, at a point in time at which the voltage of each of the capacitors is equal to the threshold voltage.

2. The differential relaxation oscillator of claim 1, wherein the clock generator comprises:
   an inverter configured to generate the clock signal by inverting the voltage of each of the capacitors when a current is applied at the point in time at which the voltage of each of the capacitors is equal to the threshold voltage.

3. The differential relaxation oscillator of claim 2, wherein the comparator comprises:
   a bias voltage generator configured to generate a bias voltage to be applied to a gate electrode of a transistor connected to the inverter based on an operating point of the inverter.

4. The differential relaxation oscillator of claim 1, wherein the differential swing booster comprises:
   a switch configured to alternately connect each of the capacitors to the DC power supply or the ground electrode based on the clock signal.

5. The differential relaxation oscillator of claim 1, wherein, when the comparator combines an offset voltage with the voltage of each of the capacitors, the capacitors are configured to be charged based on the offset voltage before being switched to connect to the DC power supply or the ground electrode based on the switching period.

* * * * *